US007505487B2

(12) United States Patent
Abe et al.

(10) Patent No.: US 7,505,487 B2
(45) Date of Patent: Mar. 17, 2009

(54) LASER OSCILLATOR INCLUDING PHOSPHORESCENT MATERIAL

(75) Inventors: Hiroko Abe, Tokyo (JP); Akihisa Shimomura, Kanagawa (JP); Satoshi Seo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 258 days.

(21) Appl. No.: 10/822,005

(22) Filed: Apr. 12, 2004

(65) Prior Publication Data

US 2004/0213308 A1  Oct. 28, 2004

(30) Foreign Application Priority Data

Apr. 23, 2003  (JP) ............................. 2003-119001

(51) Int. Cl.
*H01S 3/30*  (2006.01)
(52) U.S. Cl. .......................................... 372/7; 428/690
(58) Field of Classification Search ................ 372/87, 372/70, 39; 428/690; 252/301.16, 40
See application file for complete search history.

(56) References Cited

U.S. PATENT DOCUMENTS

| 5,260,963 | A | * | 11/1993 | Baird et al. ................... 372/95 |
| 5,307,363 | A | | 4/1994 | Hosokawa et al. |
| 5,478,658 | A | | 12/1995 | Dodabalapur et al. |
| 5,583,877 | A | * | 12/1996 | MacPherson et al. .......... 372/4 |
| 5,659,567 | A | * | 8/1997 | Roberts et al. ................. 372/82 |
| 5,703,436 | A | * | 12/1997 | Forrest et al. ................. 313/506 |
| 5,780,174 | A | | 7/1998 | Tokito et al. |
| 5,881,089 | A | | 3/1999 | Berggren et al. |
| 5,907,160 | A | | 5/1999 | Wilson et al. |
| 6,097,147 | A | | 8/2000 | Baldo et al. |

(Continued)

FOREIGN PATENT DOCUMENTS

CN  1365381  8/2002

(Continued)

OTHER PUBLICATIONS

Chen.F et al., "Triplet Exciton Confinemnet in Phosphorescect Polymer Light-Emiting Diodes,", Appl. Phys. Lett. (Applied Physics Letters), Feb. 17, 2003, vol. 82, No. 7, pp. 1006-1008.*

(Continued)

*Primary Examiner*—Miinsun Harvey
*Assistant Examiner*—Tuan N. Nguyen
(74) *Attorney, Agent, or Firm*—Fish & Richardson P.C.

(57) ABSTRACT

To provide a laser oscillator that has an oscillation wavelength in a visible region, and can enhance a conversion efficiency of photon output, and further suppress power consumption. The laser oscillator comprises a light emitting element formed on a substrate, and an optical resonator. The light emitting element includes a luminescent layer, an anode and a cathode, in which the luminescent layer is interposed between the anode and the cathode. The luminescent layer comprises a host material and a phosphorescent material, which is dispersed into the host material at a concentration of not smaller than 10 wt %. The anode and the cathode comprises a light transmitting property. In luminescence from the excimer state of the phosphorescent material, unidirectional light that intersects with the luminescent layer is amplified by the optical resonator.

35 Claims, 6 Drawing Sheets

U.S. PATENT DOCUMENTS

| | | | |
|---|---|---|---|
| 6,111,902 A | 8/2000 | Kozlov et al. | |
| 6,160,828 A | 12/2000 | Kozlov et al. | |
| 6,262,441 B1* | 7/2001 | Bohler et al. | 257/103 |
| 6,330,262 B1 | 12/2001 | Burrows et al. | |
| 6,416,888 B1 | 7/2002 | Kawamura et al. | |
| 6,445,005 B1 | 9/2002 | Yamazaki et al. | |
| 6,614,176 B2 | 9/2003 | Kim et al. | |
| 6,631,147 B2 | 10/2003 | Taniguchi et al. | |
| 6,658,037 B2 | 12/2003 | Kahen et al. | |
| 6,660,410 B2* | 12/2003 | Hosokawa | 428/690 |
| 6,665,479 B2* | 12/2003 | Gharavi | 385/122 |
| 6,687,266 B1* | 2/2004 | Ma et al. | 372/7 |
| 6,704,335 B1 | 3/2004 | Koyama et al. | |
| 6,830,828 B2 | 12/2004 | Thompson et al. | |
| 6,861,800 B2 | 3/2005 | Tyan et al. | |
| 6,863,997 B2 | 3/2005 | Thompson et al. | |
| 6,869,695 B2 | 3/2005 | Thompson et al. | |
| 6,879,618 B2 | 4/2005 | Cok et al. | |
| 6,893,743 B2 | 5/2005 | Sato et al. | |
| 6,902,830 B2 | 6/2005 | Thompson et al. | |
| 6,911,271 B1 | 6/2005 | Lamansky et al. | |
| 6,939,012 B2 | 9/2005 | Cok et al. | |
| 6,939,624 B2* | 9/2005 | Lamansky et al. | 428/690 |
| 6,942,931 B2 | 9/2005 | Lee et al. | |
| 6,951,694 B2 | 10/2005 | Thompson et al. | |
| 6,979,414 B2 | 12/2005 | Hosokawa | |
| 7,001,536 B2 | 2/2006 | Thompson et al. | |
| 7,060,370 B2 | 6/2006 | Kinoshita et al. | |
| 7,090,928 B2 | 8/2006 | Thompson et al. | |
| 7,097,916 B2* | 8/2006 | Seo et al. | 428/690 |
| 7,098,590 B2 | 8/2006 | Lim et al. | |
| 7,102,282 B1 | 9/2006 | Yamada et al. | |
| 7,211,823 B2 | 5/2007 | Tung et al. | |
| 7,291,406 B2 | 11/2007 | Thompson et al. | |
| 2002/0009274 A1 | 1/2002 | Gharavi | |
| 2002/0071963 A1* | 6/2002 | Fujii | 428/690 |
| 2003/0017361 A1 | 1/2003 | Thompson et al. | |
| 2003/0042849 A1 | 3/2003 | Ogino | |
| 2003/0054199 A1 | 3/2003 | Oh | |
| 2003/0103537 A1 | 6/2003 | Taniguchi et al. | |
| 2003/0129452 A1 | 7/2003 | Tsuji et al. | |
| 2003/0194513 A1* | 10/2003 | Carlson | 428/32.1 |
| 2003/0219058 A1 | 11/2003 | Kahen et al. | |
| 2004/0140757 A1 | 7/2004 | Tyan et al. | |
| 2004/0140758 A1 | 7/2004 | Raychaudhuri et al. | |
| 2004/0144974 A1 | 7/2004 | Lee et al. | |
| 2004/0151829 A1 | 8/2004 | Boroson et al. | |
| 2004/0155576 A1 | 8/2004 | Tyan et al. | |
| 2004/0169461 A1 | 9/2004 | Moriyama et al. | |
| 2004/0183014 A1 | 9/2004 | Yamazaki | |
| 2004/0190584 A1 | 9/2004 | Spoonhower et al. | |
| 2004/0202893 A1 | 10/2004 | Abe | |
| 2004/0262576 A1 | 12/2004 | Thompson et al. | |
| 2004/0263066 A1 | 12/2004 | Abe et al. | |
| 2005/0008052 A1 | 1/2005 | Nomura et al. | |
| 2005/0025025 A1 | 2/2005 | Nomura et al. | |
| 2005/0047458 A1 | 3/2005 | Nomura et al. | |
| 2005/0048317 A1* | 3/2005 | Seo et al. | 428/690 |
| 2005/0056856 A1 | 3/2005 | Yamazaki et al. | |
| 2005/0058162 A1 | 3/2005 | Nomura et al. | |
| 2005/0058852 A1 | 3/2005 | Tyan et al. | |
| 2005/0069012 A1 | 3/2005 | Shimomura et al. | |
| 2005/0106415 A1 | 5/2005 | Jarikov et al. | |
| 2005/0123791 A1 | 6/2005 | Deaton et al. | |
| 2006/0024526 A1 | 2/2006 | Thompson et al. | |
| 2006/0046098 A1 | 3/2006 | Hosokawa | |
| 2006/0269785 A1 | 11/2006 | Thompson et al. | |
| 2007/0296332 A1 | 12/2007 | Thompson et al. | |

FOREIGN PATENT DOCUMENTS

| | | |
|---|---|---|
| DE | 10162783 | 7/2003 |
| EP | 0 683 623 | 11/1995 |
| EP | 1205527 | 5/2002 |
| EP | 1 249 903 | 10/2002 |
| EP | 1 439 588 | 7/2004 |
| EP | 1 439 589 | 7/2004 |
| EP | 1 450 419 | 8/2004 |
| EP | 0 980 595 | 10/2004 |
| EP | 1 503 469 | 2/2005 |
| EP | 1 729 327 | 12/2006 |
| EP | 1 933 395 | 6/2008 |
| JP | 2-174288 | 7/1990 |
| JP | 05-327109 | 12/1993 |
| JP | 08-264279 | 10/1996 |
| JP | 09-190883 | 7/1997 |
| JP | 11-102783 | 4/1999 |
| JP | 11-329734 | 11/1999 |
| JP | 2000-058259 | 2/2000 |
| JP | 2000-156536 | 6/2000 |
| JP | 2001-181617 | 7/2001 |
| JP | 2001-257076 | 9/2001 |
| JP | 2002-231453 | 8/2002 |
| JP | 2002-305083 | 10/2002 |
| JP | 2002-329913 | 11/2002 |
| JP | 2002-334787 | 11/2002 |
| JP | 2002-334789 | 11/2002 |
| JP | 2002-540572 | 11/2002 |
| JP | 2003-012777 | 1/2003 |
| JP | 2003-068457 | 3/2003 |
| JP | 2003-077674 | 3/2003 |
| JP | 2004-253390 | 9/2004 |
| JP | 2004-281274 | 10/2004 |
| JP | 2005-514754 | 5/2005 |
| JP | 2006-522487 | 9/2006 |
| WO | 98/50989 | 11/1998 |
| WO | 2000/016593 | 3/2000 |
| WO | 2000/057676 | 9/2000 |
| WO | 2000/070655 | 11/2000 |
| WO | 2001/041512 | 6/2001 |
| WO | WO-01/72927 | 10/2001 |
| WO | 02/071557 | 9/2002 |
| WO | 2003/059015 | 7/2003 |
| WO | 2004/093210 | 10/2004 |

OTHER PUBLICATIONS

Chinese Office Aciton (Application No. 200410035100.4 CN 7109) dated Feb. 9, 2007.

Baldo.M et al., "Highly Efficient Phosphorescent Emission From Organic Electroluminescent Devices,", Nature, Sep. 10, 1998, vol. 395, pp. 151-154.

Andrade.B et al., "White Light Emission Using Triplet Excimers in Electrophosphorescent Organic Light-Emitting Devices,", Adv. Mater. (Advanced Materials), Aug. 5, 2002, vol. 14, No. 15, pp. 1032-1036.

Lai.S et al., "Probing D8-D8 Interactions in Luminescent Mono- and Binuclear Cyclometalated Platinum(II) Complexes of 6-Phenyl-2,2'-Bipyridines,", Inorg. Chem. (Inorganic Chemistry), 1999, vol. 38, No. 18, pp. 4046-4055.

Lai.S et al., "Spectroscopic Properties of Luminescent Platinum(II) Complexes Containing 4,4',4"-Tri-Tert-Butyl-2,2':6',2"-Terpyridine(TBU3TPY).Crystal Structures of [ (PT(TBU3TPY)CL] CLO4and [PT(TBU3TPY) {CH2C(O)ME} CLO4]", ", Inorg. Chem. (Inorganic Chemistry), 1999, vol. 38, No. 19, pp. 4262-4267.

Kvam.P et al., "Spectroscopic and Electrochemical Properties of Some Mixed-Ligand Cyclometalated Platinum(II) Complexes Derived From 2-Phenylpyridine,", Acta Chemica Scandinavica, 1995, vol. 49, pp. 335-343.

Tessler.N, "Lasers Based on Semiconducting Organic Materials,", Adv. Mater. (Advanced Materials), 1999, vol. 11, No. 5, pp. 363-370.

"International Search Report (Application No. PCT/JP2004/008810; PCT7218) Dated Oct. 5, 2004,".

"Written Opinion (Application No.PCT/JP2004/008810; PCT7218) Dated Oct. 5, 2004 (In Partial Translation),".

Office Action (U.S. Appl. No. 10/874,378; US7218) Dated Apr. 11, 2006,.

Office Action (U.S. Appl. No. 10/874,378; US7218) Dated Oct. 6, 2006,.

Office Action (U.S. Appl. No. 10/874,378; US7218) Dated Apr. 24, 2007,.

Office Action (U.S. Appl. No. 10/874,378; US7218) Dated Sep. 6, 2007,.

Office Action (U.S. Appl. No. 10/793,861; US7034) Dated May 26, 2005,.

Office Action (U.S. Appl. No. 10/793,861; US7034) Dated Nov. 11, 2005,.

Office Action (U.S. Appl. No. 10/793,861; US7034) Dated May 5, 2006,.

Office Action (U.S. Appl. No. 10/793,861; US7034) Dated Nov. 16, 2006,.

Office Action (U.S. Appl. No. 10/793,861; US7034) Dated Oct. 22, 2007,.

Office Action (U.S. Appl. No. 10/819,282; US7218) Dated Sep. 20, 2006,.

Office Action (U.S. Appl. No. 10/819,282; US7218) Dated Sep. 10, 2007,.

Office Action (U.S. Appl. No. 10/819,282; US7218) Dated Mar. 20, 2007,.

Coldren.L.A. et al., Diode Lasers and Photonic Integrated Circuits, 1995, pp. 37-44, John Wiley & Sons.

Chen.F et al., "Triplet Exciton Confinemnet in Phosphoresceect Polymer Light-Emittingdiodes,", Appl. Phys. Lett. (Applied Physics Letters), Feb. 17, 2003, vol. 82, No. 7, pp. 1006-1008.

Baldo.M et al., "Prospects for Electrically Pumped Organic Lasers,", Phys. Rev. B (Physical Review. B), Jul. 1, 2002, vol. 66, pp. 035321-1-16.

Kozlov.V et al., "Study of Lasing Action Based on Forster Energy Transfer in Optically Pumped Organic Semiconductor Thin Films,", J. Appl. Phys. (Journal of Applied Physics), Oct. 15, 1998, vol. 84, No. 8, pp. 4096-4108.

\* cited by examiner

LASER OSCILLATOR INCLUDING PHOSPHORESCENT MATERIAL

BACKGROUND OF THE INVENTION

1. Field of the Invention

The present invention relates to a laser oscillator which emits laser beam by included emission of excimer.

2. Description of the Related Art

A semiconductor laser has merits in which a laser oscillator can be drastically miniaturized and weight of the laser oscillator can be lightened as compared with the other gas lasers or solid lasers. Therefore, the semiconductor laser has been put to practical use in various fields as an optical source for sending and receiving signals by means of an optical interconnection in a photonic integrated circuit, an optical source for optical communication using an optical fiber as an optical waveguide, and an optical source used in recording on a recording medium such as optical discs, and optical memories. Further, the oscillation wavelength of the semiconductor laser extends in the range of from blue color wavelength to infrared wavelength. The semiconductor laser generally put into practical use usually includes the oscillation wavelength existing in the infrared region. Examples for the semiconductor laser in practical used include: a GaAs laser (with a wavelength of 0.84 μm); an InAs laser (with a wavelength of 3.11 μm); an InSb laser (with a wavelength of 5.2 μm); a GaAlAs laser (with a wavelength of from 0.72 μm to 0.9 μm); and an InGaAsP (with a wavelength of from 1.0 μm to 1.7 μm).

A directional characteristic or a diffraction limit in narrowing beam spot of laser beam down by an optical system depends on the wavelength of laser beam. More specifically, it is known that the shorter the wavelength is made, the more the directional characteristic is increased, which further reduces the diffraction limit. When the directional characteristic of laser beam is enhanced, disclination can be suppressed, and therefore the accuracy of sending and receiving signals via the optical interconnection in the optical communication and the photonic integrated circuit can be enhanced. As result, higher integration of the photonic integrated circuit can be achieved. In addition, when the diffraction limit is reduced, the beam spot of laser beam can be further narrowed down, and high-density recording in a recording medium such as the optical disk, and the optical memory can be performed, thereby realizing a high-capacity recording medium. As result, the formation of laser beam having shorter wavelength is a significant problem in any field using the above-mentioned semiconductor laser. Researches related to practical application of the semiconductor laser having an oscillation wavelength in the visible region have been activated.

An organic semiconductor laser having 510 nm of peak wavelength λ is disclosed in the following patent document.

[Laid-Open Disclosure Public Patent Bulletin 1]
JP 2000-156536 (page 11)

As a method for exciting (pumping) the semiconductor laser, a method of forming junction and injecting carries, an electron-beam excitation, an optical excitation, an excitation method of using avalanche breakdown and the like are known. In order to obtain included emission from the semiconductor laser, it is necessary to impart strong energy (pumping energy), which can generate a population inversion, to a semiconductor functioning as a laser medium by using the aforementioned excitation methods. However, the formation of the state in population inversion is inadequate to oscillate laser beam in practical, and therefore pumping energy higher than a threshold level, which is necessary for initiation of oscillation, must be imparted to the laser medium.

Since the level of pumping energy required for the initiation of oscillation is dependent upon the characteristics of substances that constitute the laser medium, the level varies according to the kind of the semiconductor laser. Preferably, in case of using the semiconductor laser having lower pumping energy for oscillation, a conversion efficiency to photon output from excitation input is higher, and, hence, power consumption can be suppressed. Therefore, the semiconductor laser, which can enhance the conversion efficiency of photon output while suppressing pumping energy, is anticipated. In particular, in the field in which low power consumption is directly linked to the commercial value, the improvement of the conversion efficiency of the semiconductor laser is highly expected.

SUMMARY OF THE INVENTION

The present invention has been made in view of the above, and therefore has an object to provide a laser oscillator that has an oscillation wavelength in the visible region and enables to enhance the conversion efficiency of photon output and to reduce power consumption.

In order to solve the problems above, the laser oscillator is formed by using a laser medium containing a phosphorescent material which can generate excimer by combining molecules in the excited triplet state. The laser oscillator includes an optical resonator and an excitation portion. The excitation portion has a laser medium (excitation medium) and a pumping source for supplying pumping energy to the laser medium. A material that can convert the excited triplet state into luminescence, i.e., a material that can emit phosphorescence generated in returning from the excited triplet state to the base state, is indicated as the phosphorescent material.

With respect to the laser oscillator according to the present invention, an organic metal complex with platinum as its central metal is used for the phosphorescent material and the phosphorescent material is dispersed at a high concentration of not less than 10 wt % in the laser medium. The present inventors found that dispersion of the phosphorescent material at the above-mentioned concentration is effective for generating excimer. By using the organic metal complex containing platinum as its central metal, it is possible to generate luminescence from the excimer state (excimer emission) and phosphorescence having a peak in the wavelength region of from not less than 500 nm to less than 700 nm where is a part of the visible region. Note that photons emitted from the phosphorescent material may contain fluorescence upon returning from the excited singlet state to the base state in addition to excimer emission and phosphorescence. Only excimer emission can be generated by increasing the concentration of the phosphorescent material.

It is thought that the excited singlet state and the excited triplet state are generated at a ratio of 1:3 in electroluminescence, and therefore it is known that a higher luminescent efficiency can be achieved by using the phosphorescent material. Since excimer composed by combining a molecule in the excited triplet state and a molecule in the base state is generated through the excited triplet state, the excimer has a longer lifetime of the excitation as compared with the molecule in the excited singlet state. Therefore, the excimer emission generated in the laser medium containing the above-mentioned phosphorescent material has the longer lifetime of the excitation as well as phosphorescence.

FIG. 1A shows an energy level of excimer formed by combining a molecule M in the excited triplet state with a molecule M*. As illustrated in FIG. 1A, when a molecule M in the base state (energy $E_1$) is excited by applying pumping energy, the molecule M* in the excited triplet state (energy $E_2$) can be occurred. The molecule M* in the excited triplet state is combined with the molecule M in the base state so as to form excited dimer [M+M]* in the excitation state having energy slightly lower than energy $E_2$ (energy $E_3$). The light (hv), which is emitted upon returning from the excitation state (energy $E_3$) to the base state (energy $E_1$), corresponds to excimer emission.

The lifetime of the excitation of the excited dimer [M+M]* is at a same level as the lifetime of the molecule M* in the excited triplet state, and it is relatively longer as compared with the lifetime of the excitation of the molecule M in the excited singlet state. Accordingly, the excited dimer [M+M]* can generate the population inversion with smaller pumping energy as compared with the case of using the molecule in the excited singlet state.

Further, according to the present invention, the population inversion is generated by using excimer, laser beam can be oscillated with smaller pumping energy as compared with the case of using monomer. For the purpose of comparing the case of using excimer and the case of using monomer, the energy level of a monomeric molecule M in the excited triplet state is depicted in FIG. 1B. In FIG. 1B, the molecule M in the base state (energy $E_1$) is excited by applying pumping energy such that the molecule M* in the excited triplet state (energy $E_2$) can be obtained. If it is assumed that excimer is not generated in the case of FIG. 1B, the molecule in the excited triplet state returns to the base state (energy $E_1$) when the lifetime of the excitation is expired, and at the same time, phosphorescence (hv) is emitted.

In FIG. 1A, two molecules are allowed to be in the excited state by exciting one molecule M with pumping energy as compared with FIG. 1B. Meanwhile, in FIG. 1B, each molecule is individually excited by pumping energy. As result, the population inversion can be formed with smaller pumping energy in the case of using excimer as compared with the case of using monomer.

As set forth above, with respect to luminescence obtained from the above-described phosphorescent material, only excimer emission can be obtained by increasing the concentration of the phosphorescent material. However, there is a case in which phosphorescence obtained from the monomer in the excited triplet state is also included in the obtained excimer emission according the concentration of the phosphorescent material. Therefore, photons, which are intended to be amplified in the optical resonator, can be selected by adjusting and optimizing the length (length of the resonator) between a pair of mirrors constituting the optical resonator, or the length of the laser medium between the pair of mirrors according to the wavelength of each light so as to form a standing wave.

With respect to the excitation method, the optical excitation, the method of forming a junction and injecting carriers therethrough, etc. may be used. Note that, when the optical excitation is employed, excited light contains light having the same wavelength as light that is intended to be amplified. When the method of injecting carriers is employed, a light emitting element containing the phosphorescent material in a luminescent layer may be formed such that an electron/hole pair is directly formed by supplying electric current. The light emitting element according to the present invention comprises a luminescent layer which generates electroluminescence by applying an electric field, an anode and a cathode. The luminescent layer is interposed between the anode and the cathode. Further, a hole injecting layer and a hole transporting layer etc. may be formed between the luminescent layer and the anode, whereas an electron injecting layer and an electron transporting layer etc. may also be formed between the luminescent layer and the cathode. In this case, all the layers together with the luminescent layer interposed between the anode and the cathode are referred to as an electroluminescent layer. The layer constituting the electroluminescent layer may also include an inorganic compound therein. In order to generate excimer efficiently, preferably an ionization potential of the hole transporting layer or the hole injecting layer provided in contact with the electroluminescent layer is made larger than the ionization potential of a host material or the luminescent layer. Or, preferably the gap between the ionization potential of the hole transporting layer or the hole injecting layer and the ionization potential of the host material or the luminescent layer is set to less than 0.4 eV, even if the ionization potential of the host material or the luminescent layer is larger than that of the hole transporting layer or the hole injecting layer.

According to the present invention having the aforementioned structure, a laser oscillator that enables to oscillate laser beam having an oscillation wavelength in the visible region, enhance the conversion efficiency of photon output, and suppress the power consumption can be obtained.

DETAILED DESCRIPTION OF THE PREFERRED EMBODIMENTS

Embodiment modes of the present invention will hereinafter be described with reference to the accompanying drawings. As will be easily understood by the person skilled in the art, the present invention can be implemented in the other different modes, and the embodiment modes and its details can be changed and modified unless the changes and modifications deviate from the purpose and scope of the present invention. Accordingly, interpretation of the present invention should not be limited to descriptions mentioned in Embodiment Mode 1 and Embodiment Mode 2.

Embodiment Mode 1

Figure 1A:
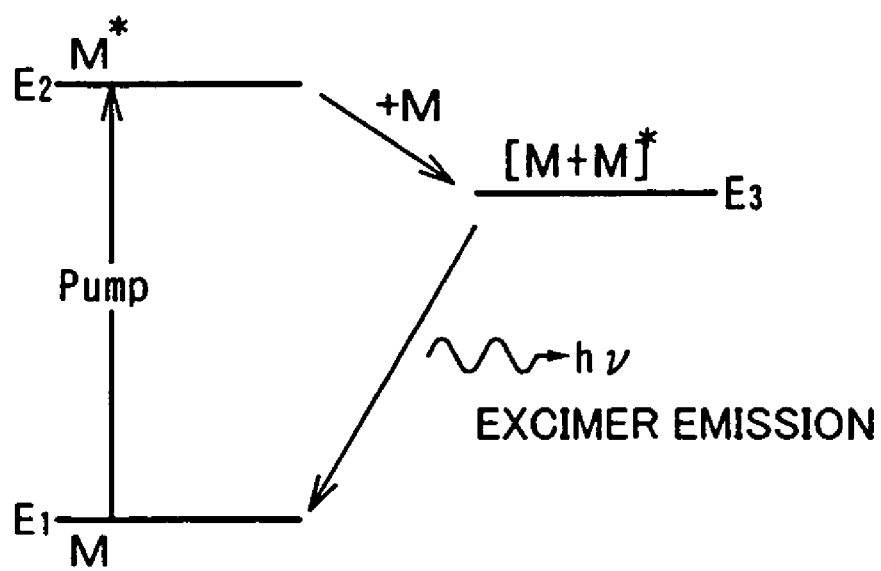
FIG. 1A is a diagram showing an energy level of a phosphorescent material in case of obtaining excimer emission and FIG. 1B is a diagram showing an energy level of the phosphorescent material in case of obtaining phosphorescence.
Figure 1B:
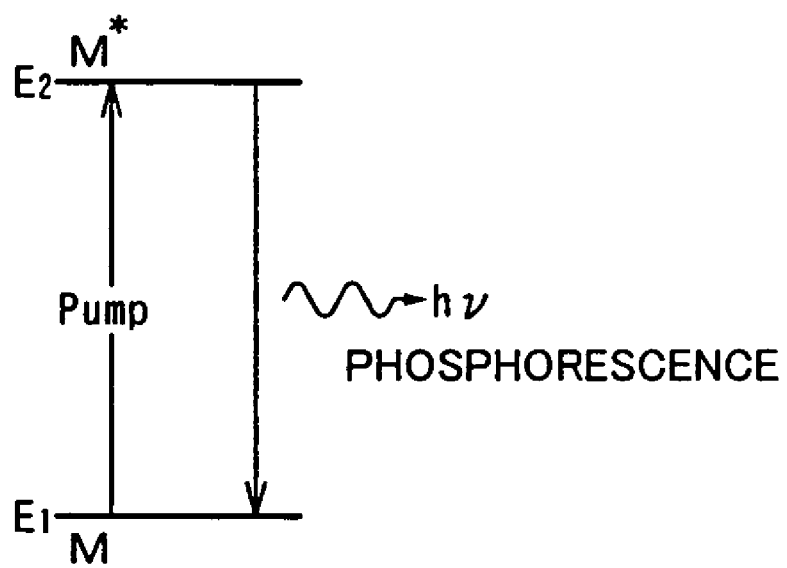
Figure 2A:
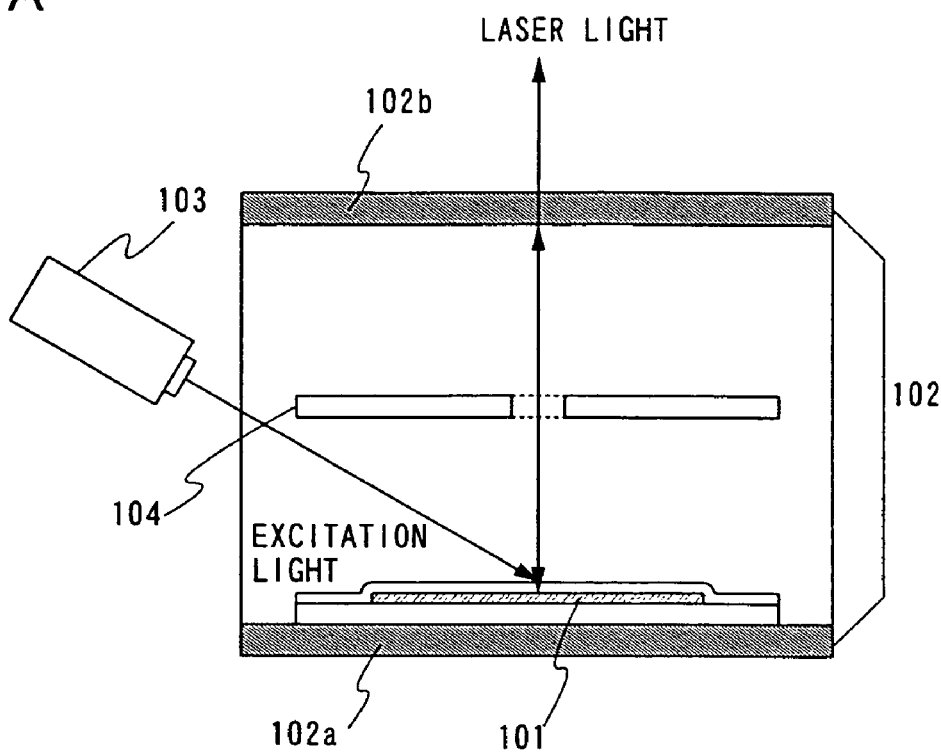
FIGS. 2A to 2C are diagrams showing constitutions of a laser oscillator using the optical excitation according to the present invention.

In Embodiment Mode 1, a structure of a laser oscillator according to the present invention will be described with reference to FIGS. 2A to 2C. In FIG. 2A, a structure of the laser oscillator using the optical excitation according to the present invention is illustrated. The laser oscillator comprises a laser medium 101 containing a phosphorescent material, an optical resonator 102, and an excitation light source 103. In the present invention, an organic metal complex with platinum as its central metal is contained in the laser medium 101. More specifically, when the laser medium 101 in which substances as depicted in the following chemical formulas 1 to 4 are dispersed in a host material at a concentration of not less than 10 wt % is used, both phosphorescence and excimer emission can be generated.

[Chemical Formula 1]

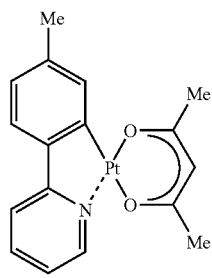

(1)

[Chemical Formula 2]

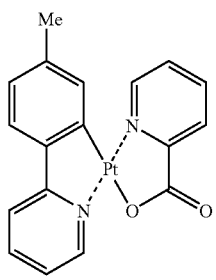

(2)

[Chemical Formula 3]

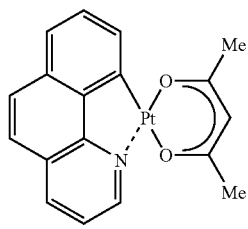

(3)

[Chemical Formula 4]

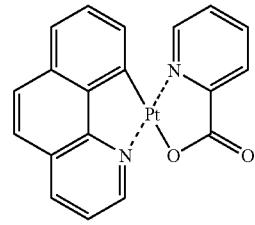

(4)

Aromatic amine-based compounds (namely, those having benzene ring-nitrogen bonds) can be used as the host material in case of using the phosphorescent material as a guest material. Materials widely used as the aromatic amine-based compounds include:
N,N'-bis(3-methylphenyl)-N,N'-diphenyl-1,1'-biphenyl-4, 4'-diamine (abbreviated as TPD); and derivatives thereof such as: 4,4'-bis[N-(1-naphthyl)-N-phenyl-amino]-biphenyl (abbreviated as α-NPD). Also used are star burst aromatic amine compounds, including:
4,4',4"-tris(N,N-diphenyl-amino)-triphenylamine (abbreviated as TDATA); and
4,4',4"-tris[N-(3-methylphenyl)-N-phenyl-amino]-tripheny lamine (abbreviated as MTDATA).
The examples also include metal complexes such as:
tris(8-quinolinolato)aluminum (abbreviated as $Alq_3$);
tris(4-methyl-8-quinolinolato)aluminum (abbreviated as $Almq_3$); bis(10-hydroxybenzo[h]-quinolinato)beryllium (abbreviated as $BeBq_2$);
bis(2-methyl-8-quinolinolate)-(4-hydroxy-biphenylyl)-alu minum (abbreviated as BAlq);
bis[2-(2-hydroxyphenyl)-benzoxazolato]zinc (abbreviated as $Zn(BOX)_2$); and
bis[2-(2-hydroxyphenyl)-benzothiazolato]zinc (abbreviated as $Zn(BTZ)_2$). Other than the aforementioned metal complexes, the other materials that are suitable for the host materials include: oxadiazole derivatives such as 2-(4-biphenylyl)-5-(4-tert-butylphenyl)-1,3,4-oxadiazole (abbreviated as PBD), and
1,3-bis[5-(p-tert-butylphenyl)-1,3,4-oxadiazole-2-yl]ben zene (abbreviated as OXD-7); triazole derivatives such as 3-(4-tert-butylphenyl)-4-phenyl-5-(4-biphenylyl)-1,2,4-t riazole (abbreviated as TAZ), and
3-(4-tert-butylphenyl)-4-(4-ethylpheyl)-5-(4-biphenylyl)-1, 2,4-triazole (abbreviated as p-EtTAZ); imidazole derivatives such as
2,2',2"-(1,3,5-benzenetrile)tris[1-phenyl-1H-benzimidazo le] (abbreviated as TPBI); and phenanthroline derivatives such as bathophenanthroline (abbreviated as BPhen) and bathocuproin (abbreviated as BCP).
Furthermore, bipolar materials such as 4,4'-N,N'-dicarbazole-biphenyl (abbreviated as CBP) may also be used as the host materials.
CBP is used as the host material, Pt(tpy)acac explained in the aforementioned chemical formula 1 is used as the guest material, and added at a concentration of 15 wt % so as to form the laser medium with a thickness of 20 nm by coevaporation. In this case, the laser medium generates three components of a green color generated by phosphorescence of Pt(tpy)acac (with a wavelength of about 490 nm), another green color generated by phosphorescence of Pt(tpy)acac (with a wavelength of about 530 nm), and orange color generated by excimer emission (with a wavelength of about 570 nm). In Embodiment Mode 1, laser beam can be obtained by amplifying excimer emission (with a wavelength of about 570 nm) by use of the optical resonator 102.

A flash lamp encapsulated with Xe, Kr or Ar therein, a super high pressure mercury-vapor lamp, a nitrogen laser, a $GaAs_xP_{(1-x)}$ semiconductor laser and the like can be used as the excitation light source 103.

In FIG. 2A, the optical resonator 102 comprises reflective materials 102a and 102b for reflecting light. The reflective materials 102a and 102b are disposed such that light generated in the laser medium 101 travels back and forth between the reflective materials 102a and 102b within the optical resonator 102. When one of the reflective materials 102a and 102b, which are accommodated in the optical resonator 102, has higher reflectance as compared with another one, laser beam can be obtained from the reflective material having lower reflectance (that is the reflective material 102b, here).

Reference numeral 104 designates a pinhole for locking modes. Note that the pinhole 104 is not always necessary to be provided. The other modulation elements may be provided for locking modes as substitute for the pinhole.

Mirrors can be used as the reflective materials 102a and 102b. However, the reflective materials are not limited thereto and the other material can be used as the reflective materials as long as the materials has a structure in which light is enclosed in the optical resonator so as to obtain laser beam by oscillating light generated in the laser medium 101. The optical resonator 102 may be formed by utilizing materials having lower refractive index to enclose light in the optical resonator as compared with the laser medium 101. For instance, a silicon oxide film, metal and the like can be used for the materials.

The excitation light source 103 corresponds to a pumping source for supplying pumping energy to the laser medium 101. In Embodiment Mode 1, a molecule of the phosphorescent material contained in the laser medium 101 is excited to the triplet state, and the excited molecule and a neighboring molecule in the base state are bonded each other, thereby generating excimer. Excimer emission spontaneously emitted from the excimer generates included emission, and light only emitted in the axial direction between the reflective materials 102a and 102b of the optical resonator 102 is selectively amplified, and therefore laser beam is oscillated from the reflective material 102b.

In addition to excimer emission, phosphorescence can also be obtained from the laser medium 101 containing the phosphorescent material. When laser beam is generated by excimer emission, the reflective materials 102a and 102b are arranged such that the length L of the optical resonator becomes an integral multiple of one half of the wavelength $\lambda$ of excimer emission. Similarly, when laser beam is generated by using phosphorescence obtained from the laser medium 101, the reflective materials 102a and 102b are arranged such that the length L of the optical resonator becomes an integral multiple of one half of the wavelength $\lambda$ of phosphorescence.

The electroluminescent material that generates electroluminescence generically tends to be deteriorated by moisture, oxygen and the like. Therefore, the laser medium 101 is disposed in a hermetically sealed condition within the optical resonator 102 according to Embodiment Mode 1. FIG. 2B shows an enlarged view of the laser medium 101 in the hermetically sealed condition as shown in FIG. 2A.

Figure 2B:
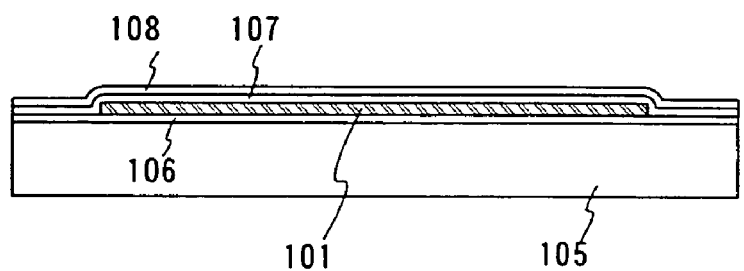

The laser medium 101 is sealed with a substrate 105 and a plurality of insulating films 106 to 108 in FIG. 2B. More specifically, the laser medium 101 is formed in contact with the insulating film 106 formed on the substrate 105. The insulating films 107 and 108 are sequentially formed on the insulating film 106 so as to cover the laser medium 101. The insulating films 106 to 108 are formed of an insulating film which has a relatively superior effect for preventing moisture and oxygen from intruding into the laser medium and can transmit light generated in the laser medium. Desirably, for instance, an insulating film containing nitrogen as represented by silicon oxynitride or silicon nitride is used for the insulating films. The number of the insulating films for sealing the laser medium 101 is not limited thereto. Further, the materials for the insulating films are not limited to inorganic materials, and insulating films formed of organic materials or a lamination layer of an organic insulating film and an inorganic insulating film may also be used.

FIG. 2B only shows one embodiment mode for sealing the laser medium 101, and the present invention is not limited thereto. FIG. 2C shows a state of sealing the laser medium 101 in a different mode from FIG. 2B.

Figure 2C:
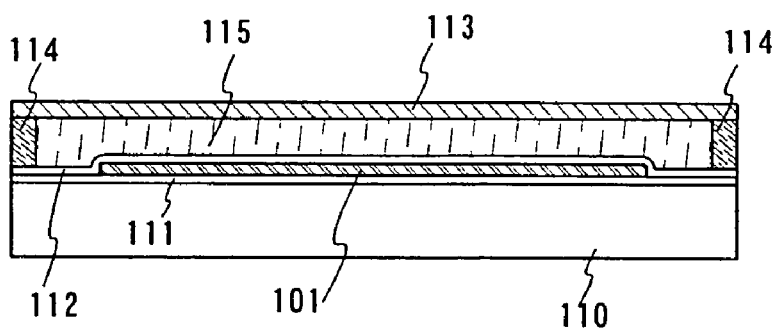

The laser medium 101 is formed in contact with an insulating film 111 formed on a substrate 110 in FIG. 2C. An insulating film 112 is further formed on the insulating film 111 so as to cover the laser medium 101. The laser medium 101 is surrounded by a sealing material 114 formed on the insulating film 112, and the laser medium and a filler 115 are encapsulated between the substrate 110 and a covering material 113. As the filler 115, a resin added with a hygroscopic substance such as barium oxide can be used. With respect to the resin used for the filler, an ultraviolet light curable resin or a thermal curable resin can be used. More specifically, PVC (polyvinyl chloride), acrylic, polyimide, epoxy resin, silicone resin, PVB (polyvinyl butyral) or EVA (ethylene vinyl acetate) can be used. In addition to the aforementioned materials, an inert gas such as nitrogen, and argon, can be used as the filler 115.

The constitution of the laser oscillator as illustrated in FIG. 2A is only one embodiment mode of the laser oscillator according to the present invention. Furthermore, the excitation method used for the laser oscillator according to the present invention is not limited to the optical excitation as mentioned in Embodiment Mode 1, and the other excitation methods may also be used.

The lifetime of the excitation of the excited dimer of the organic metal complex using platinum as its central metal is same level as the lifetime of the excitation in the excited triplet state, and is relatively longer than that in the excited singlet state. As result, the condition of population inversion can be formed with smaller pumping energy as compared with the case of the excited singlet state. In addition, since the excitation of one molecule with pumping energy can lead two molecules to the exited state, the population inversion can be generated with lesser pumping energy. Accordingly, the power consumption that is required for oscillating laser beam can be suppressed. Furthermore, laser beam obtained by excimer emission exists in the visible region having a shorter oscillation wavelength than that in the infrared region, which results in superior directional characteristics and a smaller diffraction limit.

In Embodiment Mode 1, light obtained by included emission is amplified in one direction which intersects with the film formed of the laser medium, i.e., in a direction of the film thickness. However, the present invention is not limited thereto. The direction of amplifying light obtained by included emission may exist at the inside of the film formed of the laser medium.

Embodiment Mode 2

A structure of the laser oscillator using the method of injecting carriers according to the present invention will be described in Embodiment Mode 2.

In order to inject carriers into a laser medium, the laser medium is used as a luminescent layer so as to form a light emitting element comprising an anode and a cathode which sandwich the luminescent layer therebetween. A phosphorescent material in the laser medium is excited by supplying excited electric currents into the light emitting element, and emitted light is resonated in the optical resonator, thereby obtaining laser beam.

Figure 3A:
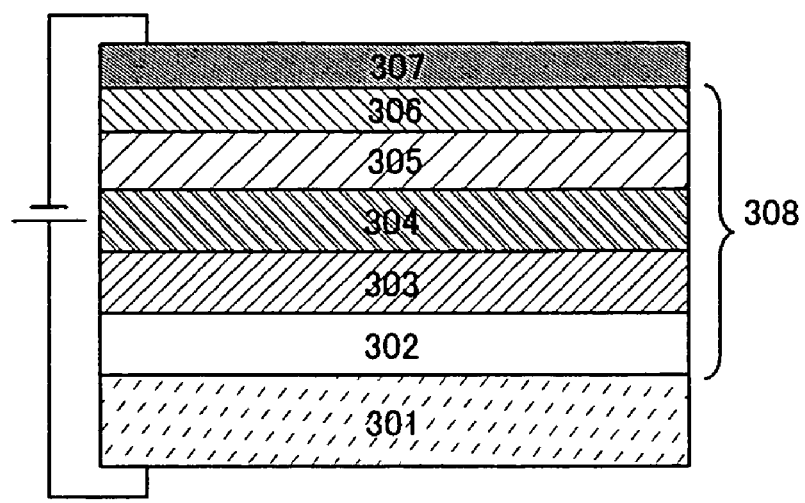
FIG. 3A is a diagram showing an element structure of a light emitting element used for the laser oscillator according to the present invention.

FIG. 3A shows an element structure of the light emitting element used in Embodiment Mode 2. The light emitting element as depicted in FIG. 3A comprises a structure in which an electroluminescent layer 308 is interposed between an anode 301 and a cathode 307. The electroluminescent layer 308 is composed by sequentially laminating a hole injecting layer 302, a hole transporting layer 303, a luminescent layer 304, an electron transporting layer 305, and an electron injecting layer 306 from the side of the anode 301. A phosphorescent material such as the aforementioned platinum complex (above-described chemical formulas 1 to 4) is diffused to a host material at a higher concentration (specifically, up to 10 wt %) in the luminescent layer 304, and, hence, both phosphorescence and excimer emission can be emitted.

Note that the light emitting element used for the laser oscillator according to the present invention may contain at least the above-mentioned luminescent layer in the electroluminescent layer. The layers exhibiting functions other than luminescence (such as the hole injecting layer, the hole transporting layer, the electron transporting layer, and the electron injecting layer) can be arbitrary combined with the luminescent layer. Materials available for the above-mentioned layers will hereinafter be described in more detail, respectively. However, the materials applicable to the present invention is not limited thereto.

Porphyrins are effective as a hole injection material for forming the hole injecting layer 302, in the case of an organic compound, for example, phthalocyamine (abbreviated as $H_2$-Pc), copper phthalocyamine (abbreviated as Cu-Pc), and the like may be used. A material that is a conductive high molecular compound treated by chemical doping can also be used. Further, polyethylene dioxythiophene (abbreviated as PEDOT) doped with polystyrene sulfone (abbreviated as PSS), polyaniline (abbreviated as PAni), polyvinyl carbazole (abbreviated as PVK), and the like can be given as examples. In addition, a thin film of an inorganic semiconductor such as vanadium pentoxide and an ultra thin film of an inorganic insulator such as aluminum oxide are also effective for the hole injecting layer 302.

As a hole transporting material used for forming the hole transporting layer 303, an aromatic amine-based compound (that is, compound having a benzene ring-nitrogen bond) is preferred. The aromatic amine-based compound includes, for example, TPD and derivatives thereof such as α-NPD. Also, star burst aromatic amine compounds such as TDATA, and MTDATA can be used. Further, 4,4',4"-tris (N-carbazole) triphenyl amine(abbreviated as TCTA) may also be used. Preferably, an ionization potential of the hole transporting layer 303 in contact with the luminescent layer 304 is made larger than the ionization potential of the host material or the luminescent layer in order to generate excimer effectively. Or, preferably, the gap between these ionization potentials is suppressed to less than 0.4eV even if the ionization potential of the host material or the luminescent layer is larger than that of the hole transporting layer. When the organic metal complex, which is explained in the chemical formula 1, is used for the luminescent layer 304 as the phosphorescent material, the ionization potential of the phosphorescent material can be set at the same level as that of the hole transporting layer 303 by using TCTA for the hole transporting layer 303, and hence, excimer can be formed, efficiently.

Specific examples of an electron transporting material used for forming the electron transporting layer 305 include metal complexes such as $Alq_3$, $Almq_3$, $BeBq_2$, BAlq, $Zn(BOX)_2$, and $Zn(BTZ)_2$. In addition to the metal complexes, other materials that are suitable for the electron transporting layer include: oxadiazole derivatives such as PBD, and OXD-7; triazole derivatives such as TAZ, and p-EtTAZ; imidazole derivatives such as TPBI; and phenanthroline derivatives such as BPhen, and BCP.

Aforementioned electron transporting materials can be employed for an electron injecting material used for forming the electron injecting layer 306. In addition, an ultra thin film of an insulator, which is formed of alkali metal halide such as LiF and CsF, alkaline-earth halide such as $CaF_2$, and alkali metal oxide such as $Li_2O$, is often used as the electron injecting layer. Further, alkali metal complexes such as lithium acetyl acetate (abbreviated as Li(acac)) and 8-quinolinolato-lithium (abbreviated as Liq) are also effective.

As the host material used for the luminescent layer 304, the hole transporting materials or the electron transporting materials which are represented by the above-described examples can be used. Further, bipolar materials such as 4,4'-N,N'-dicarbazole-biphenyl (abbreviated as CBP) are usable.

As a material used for forming the anode 301, a conductive material having a high work function is preferred. When photons are emitted from the side of the anode 301, the anode is preferably formed of a transparent conductive material such as indiumtin oxide(ITO), and indiumzinc oxide (IZO). Meanwhile, when the anode 301 has a light blocking effect such that photons are not emitted from the side of the anode 301, the anode may be a single layer formed of an element selected from a group consisting of TiN, ZrN, Ti, W, Ni, Pt, Cr, etc., or a lamination layer composed of a film containing titanium nitride and aluminum as its principal components, or a lamination layer composed of a titanium nitride film, a film containing aluminum as its principal component and another titanium nitride film. The anode may also be formed by laminating the above-mentioned transparent conductive material on a reflective electrode such as Ti, and Al.

As a material used for forming the cathode 307, a conductive material having a low work function is preferred. Specific examples of the material used for forming the cathode include: alkali metal such as Li, and Cs; alkaline-earth metal such as Mg, Ca, and, Sr; and an alloy containing above elements (such as Mg:Ag, and Al:Li). Further, the cathode can be formed of rare-earth metal such as Yb, and Er. In case of using the electron injecting layer 306 formed of LiF, CsF, $CaF_2$, $Li_2O$ or the like, the cathode can be formed of a normal thin conductive film such as aluminum. When photons are emitted from the side of the cathode 307, the cathode may be formed by laminating alkali metal such as Li and Cs, a ultra thin film containing alkaline-earth metal such as Mg, Ca, and Sr, and a transparent conductive film (formed of ITO, IZO, ZnO or the like). Or, alkali metal or alkaline-earth metal and the electron transporting material are coevaporated to form the electron injecting layer 306, and the transparent conductive film (formed of ITO, IZO, ZnO and the like) may be further laminated thereon.

In case of manufacturing the light emitting elements as mentioned above, the method of laminating each layer among the light emitting elements is not limited to the present invention. And, any lamination methods such as vapor deposition, spin coating, ink jetting, and dip coating are available.

Figure 3B:
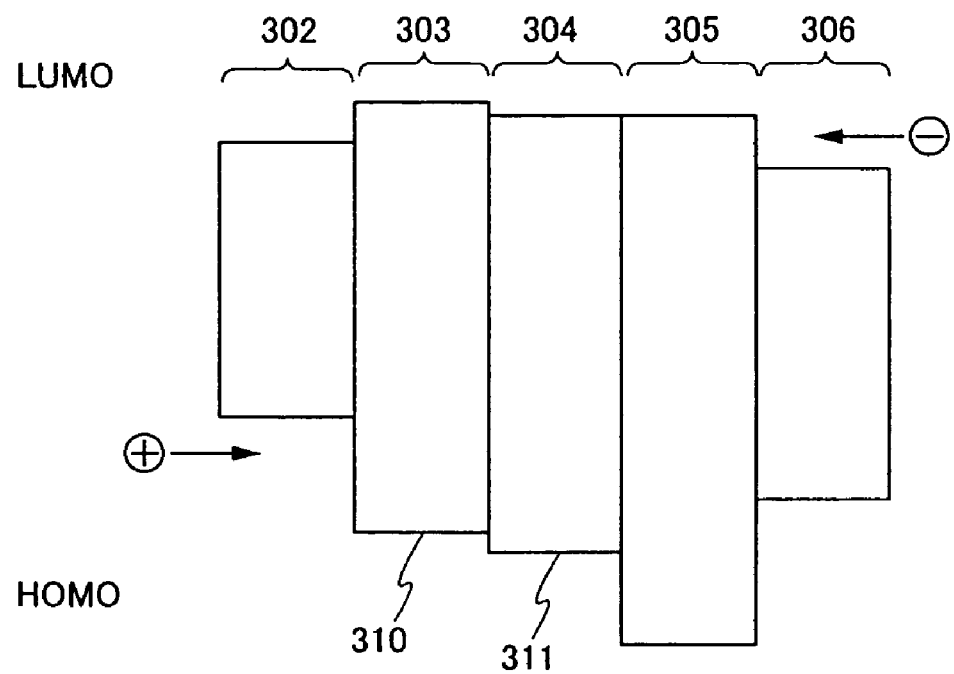
FIG. 3B is a band diagram of an electroluminescent layer in the light emitting element.

FIG. 3B shows a band diagram in the case where the anode 301 is formed of ITO, the hole injecting layer 302 is formed of Cu-Pc, the hole transporting layer 303 is formed of TCTA, the host material of the luminescent layer 304 is formed of CBP, the guest material of the luminescent layer is formed of Pt(tpy)acac as explained in the foregoing chemical formula, the electron transporting layer 305 is formed of BCP, the electron injecting layer 306 is formed of $CaF_2$, and the cathode 307 is formed of Al among the light emitting elements as depicted in FIG. 3A.

The highest occupied molecular orbital (HOMO) level (ionization potential) and the lowest unoccupied molecular orbital (LUMO) level of the hole injecting layer 302, the hole transporting layer 303, the luminescent layer 304, the electron transporting layer 305 and the electron injecting layer 306 are depicted in FIG. 3B, respectively.

With respect to the light emitting elements as depicted in FIG. 3A, when the ionization potential 310 of the hole transporting layer 303 is higher than the ionization potential 311 of the luminescent layer 304, and the energy gap therebetween is more than 0.4 eV, a large number of carriers are recombined in the vicinity of an interface between the hole transporting layer 303 and the luminescent layer 304, and, hence, unnecessary light is emitted from the hole transporting layer 303. In order to prevent the phenomena, the ionization potential of the hole transporting layer 303 is preferably made lower than that of the phosphorescent material or the energy gap therebetween is preferably set to not more than 0.4 eV even if the ionization potential of the phosphorescent material is higher than that of the hole transporting layer so as to recombine the carries in the luminescent layer 304, preferentially. According to the aforementioned constitution, holes easily penetrate into the luminescent layer 304 from the hole transporting layer 303, and, hence, carriers can be preferentially recombined in the luminescent layer 304. In addition, another hole transporting layer having the ionization potential lower than that of the hole injecting layer 302, which is higher than that of the hole transporting layer 303, may be provided between the hole injecting layer 302 and the hole transporting layer 303 such that the holes easily penetrates into the hole transporting layer 303 from the hole injecting layer 302.

Figure 4A:
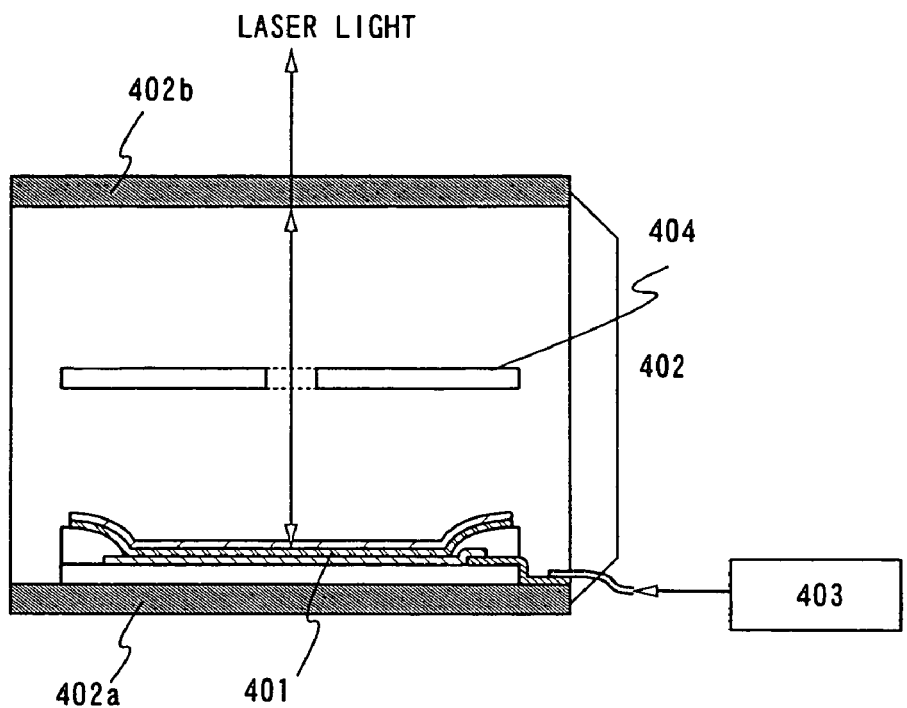
FIGS. 4A to 4C are diagrams showing structures of the laser oscillator using an excitation method performed by injecting carriers according to the present invention.

FIG. 4A shows a structure of a laser oscillator according to the present invention in case of using the excitation method executed by injecting carriers. The laser oscillator as depicted in FIG. 4A comprises a laser medium 401 including a phosphorescent material, an optical resonator 402, and a power source for excitation 403. With respect to the laser medium 401, the organic metal complex with platinum as its central metal, which is described in the foregoing chemical formulas 1 to 4, is dispersed in a host material at a concentration of more than 10 wt %, as well as Embodiment Mode 1. When the laser medium 401 is used, both phosphorescence and excimer emission can be emitted.

As well as Embodiment Mode 1, the optical resonator 402 includes reflective materials 402a and 402b. The reflective materials 402a and 402b are arranged such that light generated in the laser medium 401 travels back and forth between the reflective materials 402a and 402b within the optical resonator 402. When one of the reflective materials 402a and 402b used for the optical resonator 402 has a reflectance higher than that of another one, laser beam can be generated from another reflective material having a lower reflectance (which is the reflective material 402b, here). Reference numeral 404 designates a pinhole for locking mode. Note that the pinhole 404 is not always necessary to be provided. In order to lock mode, other modulation elements may be provided instead of the pinhole.

In Embodiment Mode 2, the power source for excitation 403 corresponds to a pumping source for supplying pumping energy to the laser medium 401. The molecule of the phosphorescent material contained in the laser medium 401 is excited to the triplet state by excited electric current supplied to the laser medium from the power source for excitation 403, and therefore the excited molecule and a molecule in the base state, which is adjacent to the excited molecule, are combined to generate excimer. Subsequently, included emission is generated by excimer emission that is spontaneously emitted from thus obtained excimer, light only emitted in the axial direction between the reflective materials 402a and 402b of the optical resonator 402 is selectively amplified, and then laser beam is oscillated by the reflective material 402b.

Figure 4B:
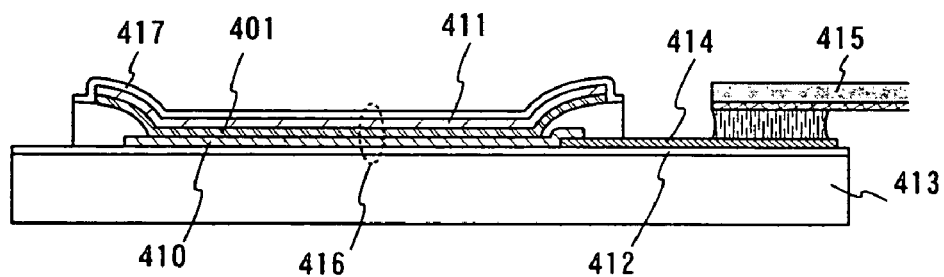

FIG. 4B shows an enlarged view of the laser medium 401 and the light emitting element using the laser medium 401 as the luminescent layer, which are illustrated in FIG. 4A. As illustrated in FIG. 4B, in case of using the excitation method executed by injecting carriers, the light emitting element is formed as follows: the laser medium 401 is used as the luminescent layer; and an anode 410 and a cathode 411 are formed so as to sandwich the luminescent layer therebetween. Although the anode 410, the laser medium 401, and the cathode 411 are sequentially formed on the substrate 413 with the insulating film 412 formed thereon in FIG. 4B, the positions of the anode 410 and the cathode 411 may be inverted. Further, the hole injecting layer, the hole transporting layer, the electron transporting layer, the electron injecting layer and the like may arbitrarily be interposed between the anode 410 or the cathode 411 and the laser medium 401 functioning as the luminescent layer. When the optical resonator 402 as depicted in FIG. 4A is used, the anode 410 and the cathode 411 are formed of electrodes that transmits light generated in the laser medium 401. More specifically, the electrodes may be composed of a translucent material. Or, the electrodes may be formed of a thin film (for instance, with a film thickness of about from 5 to 30 nm) that can transmit light even if the material does not have a light transmitting property.

An excited electric current is supplied from the power source for excitation 403 via a wiring 414 so as to flow electric current in the forward bias direction between the anode 410 and the cathode 411. In particular, excited electric current is supplied from the power source for excitation 403 into the laser medium 401 via a connector 415 such as FPC, which is connected to the wiring 414.

Figure 4C:
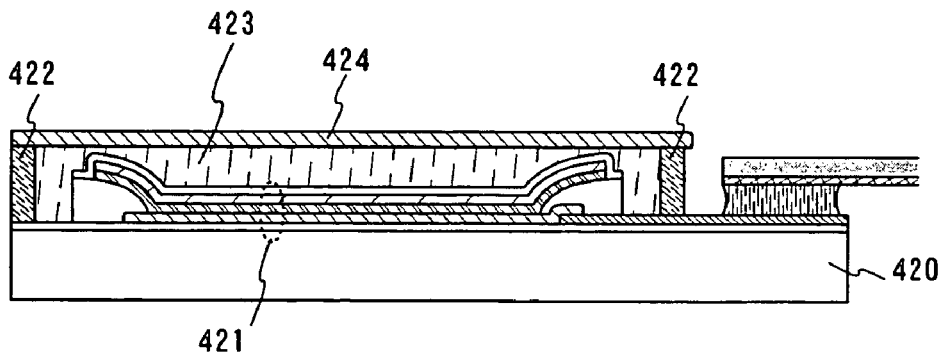

In FIG. 4B, the light emitting element 416 is composed of the anode 410, the cathode 411, and the laser medium 401 as well as FIG. 2. The light emitting element is covered and sealed with the insulating film 417 composed of a single layer or a plurality of layers so as not to be exposed to moisture and oxygen, which suppresses deterioration of the electroluminescent materials. The light emitting element may be sealed with a covering material in the same manner as that of FIG. 2C. FIG. 4C shows a state in which the light emitting element 421 formed on the substrate 420 is surrounded with a sealing material 422, and the light emitting element 421 and a filler 423 are sealed between the substrate 420 and the covering material 424.

Note that, in case of using the excitation method performed by injecting carriers, any one of the anode and cathode may be formed of an electrode that is composed of a light reflecting material, and light generated in the laser medium may be resonated with the light reflecting electrode and the reflective materials.

Although light obtained by included emission is amplified in the thickness direction of the film composed of the laser medium in Embodiment Mode 2, the present invention is not limited this example. The direction of amplification of light obtained by included emission may exist inside of the film formed of the laser medium.

In case of using the excitation method performed by injecting carriers, light output can be directly modulated by controlling excited electric current.

EMBODIMENTS

Embodiment 1

In Embodiment 1, the positional relationship between two reflective materials and a laser medium in the case where the direction of amplification of light, which is obtained by included emission, exists inside of a film formed of a laser medium.

Figure 5A:
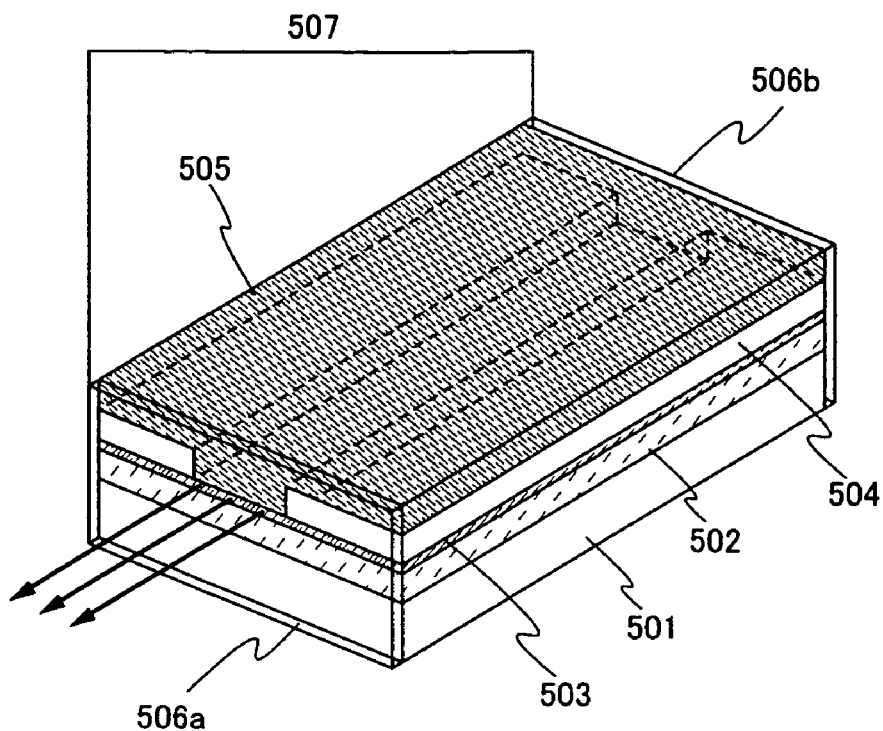
FIGS. 5A and 5B are diagrams showing a positional relationship between two reflective materials and a laser medium in the case where an amplified direction of photons obtained by included emission exists inside of the film formed of a laser medium.

The positional relationship between the laser medium and the optical oscillator of the laser oscillator in which molecules are excited by carrier injection is illustrated in FIG. 5A. Reference numeral 501 denotes a substrate for holding the laser medium on which an anode 502, an electroluminescent layer 503 including a luminescent layer that corresponds to the laser medium, an insulating film 504 and a cathode 505 are sequentially laminated. The insulating film 504 comprises a groove-shape opening. In the opening, the electroluminescent layer 503 contacts to the cathode 505. Therefore, in the electroluminescent layer 503, carriers are injected in the region where is overlapped with the cathode 505 in the opening, and then light due to included emission is emitted in the overlapping region.

Reflective materials 506a and 506b accommodated in an optical resonator 507 sandwich the electroluminescent layer 503 therebetween, and the reflective films are further formed so as to intersect with a surface formed of the electroluminescent layer 503, respectively. Light emitted from the electroluminescent layer 503 is resonated with the reflective materials 506a and 506b, and, hence, laser beam, which is oscillated in the same direction as an axis between the reflective materials 506a and 506b, can be obtained.

Although the case of using the excitation method performed by injecting carriers is illustrated in FIG. 5A, the present invention is not limited to the method. In case of using the optical excitation method, for instance, the layer containing the laser medium is interposed between two reflective materials accommodated in the optical resonator, and a surface formed of the layer containing the laser medium and the two reflective materials are arranged so as to intersect each other, respectively, as well as the method performed by injecting carriers. Note that the anode and the cathode are not necessary to be provided. In accordance with the above-mentioned structure, light emitted from the layer containing the laser medium is resonated with the two reflective materials, and therefore laser beam oscillating in the axial direction between the two reflective materials can be obtained.

Figure 5B:
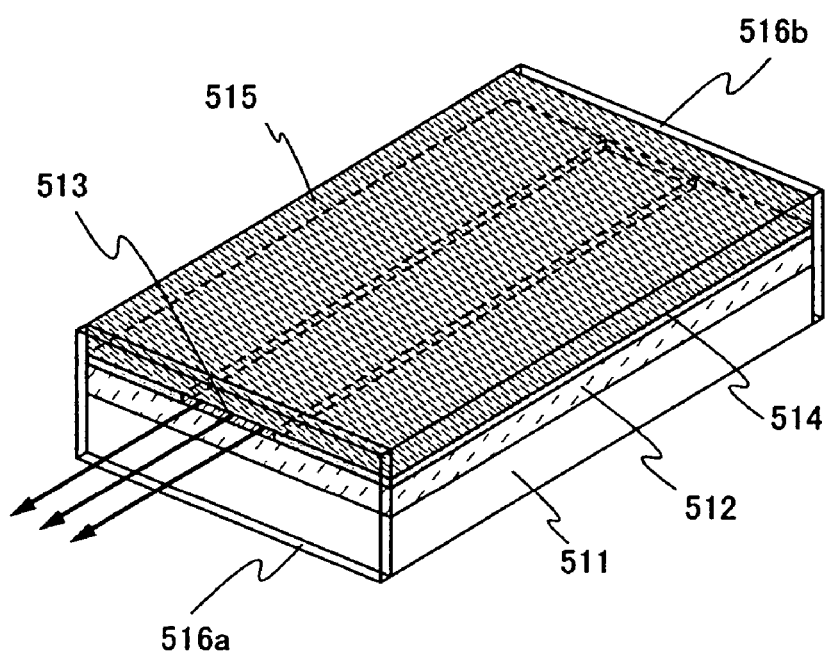

FIG. 5B shows another positional relationship between the laser medium and the optical resonator of the laser oscillator in which molecules are excited by carrier injection, although the structure is different from that of FIG. 5A. Reference numeral 511 denotes a substrate for holding the laser medium on which an anode 512 is formed. An insulating film 514 comprising a groove-shape opening and an electroluminescent layer 513 formed in the opening are formed on the anode 512. Further, a cathode 515 is formed on the insulating film 514 and the electroluminescent layer 513. According to the foregoing structure, the anode 512, the electroluminescent layer 513 and the cathode 515 are sequentially overlapped and contacted each other in a region where these layers are overlapped with the opening portion. Thus, light is emitted due to included emission.

In an optical resonator 507, reflective materials 516a and 516b sandwich the electroluminescent layer 513 therebetween, and are formed so as to intersect with the surface which is formed of the electroluminescent layer 513. Subsequently, light emitted from the electroluminescent layer 513 is resonated with the reflective materials 516a and 516b, and hence, laser beam is oscillated in a same direction as an axis between the reflective materials 516a and 516b.

In order to confine light emitted from the electroluminescent layer 513 effectively, an optical waveguide is formed by using the insulating film 514 in FIG. 5B. Specifically, the optical waveguide is formed of a material having lower refractive index such as silicon oxide as compared with the electroluminescent layer 513. According to the above-mentioned structure, a semiconductor laser can be effectively oscillated.

Although the case of using the excitation method which is carried out by injection carriers is described in FIG. 5B, the excitation method is not limited thereto. As well as the method of injecting carriers, in case of using the optical excitation method, for instance, two reflective materials are arranged as follows: the layer containing the laser medium is interposed between the reflective materials; and the two reflective materials intersect with a surface of the layer containing the laser medium. According to the above-mentioned structure, light emitted form the layer containing the laser medium is resonated with the two reflective materials, and, hence, laser beam is oscillated in the same direction as the axis between the reflective materials.

Embodiment 2

In Embodiment 2, a method of manufacturing the light emitting element as depicted in FIG. 3A will be described. In this case, the anode 301 is formed of ITO; the hole injecting layer 302 is formed of Cu-Pc; the hole transporting layer 303 is formed of TCTA; the host material of the luminescent layer 304 is formed of CBP, the guest material of the luminescent layer 304 is formed of Pt(tpy)acac; the electron transporting layer 305 is formed of BCP; the electron injecting layer 306 is formed of $CaF_2$; and the cathode 307 is formed of Al.

The anode 301 which serves as the light emitting element is formed on a glass substrate including an insulated surface. The anode 301 is formed of ITO which is a transparent conductive film, and is formed to a thickness of 110 nm by sputtering. Subsequently, the electroluminescent layer 308 is formed on the anode 301. The electroluminescent layer 308 is formed by laminating the hole injecting layer 302, the hole transporting layer 303, the luminescent layer 304, the electron transporting layer 305, and the electron injecting layer 306. The luminescent layer 304 is composed of the host material, and the guest material which generates phosphorescence.

At first, the substrate with the anode 301 formed thereon is fixed to substrate holders in a vacuum deposition apparatus, while keeping the side of the surface with the anode 301 formed thereon down. Cu-PC is filled in an evaporation source which is equipped in the vapor deposition device to form the hole injecting layer 302 with a thickness of 20 nm by vapor deposition using resistive heating. Subsequently, the hole transporting layer 303 is formed of a material which is superior in hole transporting properties and luminescent properties. In this embodiment, the hole transporting layer 303 is formed of α-NPD with a thickness of 30 nm by the same method as the hole injecting layer. The luminescent layer 304 is further formed with a thickness of 20 nm by coevaporation. The host material formed of the luminescent layer 304 is formed of CBP and the guest material of the luminescent layer is formed of Pt(tpy)acac, which is described in the above-mentioned chemical formula 1, and its concentration is adjusted to be 15 wt %. The electron transporting layer 305 is formed on the luminescent layer 304. The electron transporting layer 305 is formed of BCP (bathocuproin) to a thickness of 20 nm by vapor deposition. On the electron transporting layer 305, $CaF_2$ is formed as the electron injecting layer 306 to a thickness of 2 nm, and, hence, the electroluminescent layer 308 comprising the above-mentioned laminated structure is formed.

Finally, the cathode 307 is formed. In Embodiment 2, the cathode 307 is formed of aluminum (Al) to a thickness of 20 nm by vapor deposition using resistive heating. Since the cathode 307 is a thin film with the above-mentioned thickness, light generated in the luminescent layer 304 can be emitted from the side of the cathode 307. If the direction of oscillation of laser beam exists within a surface composed of the luminescent layer 304, the cathode 307 may not always have the structure in which light transmits through the cathode. Meanwhile, when the cathode 307 is used as the reflective materials of the optical resonator, the cathode 307 must have a structure that allows to transmit light, even if laser beam is emitted in a same direction as the thickness direction of the luminescent layer 304.

As set forth above, the light emitting element according to the present invention can be manufactured. With respect to the structure as described in Embodiment 1, since luminescence is generated in the hole transporting layer 303 and the luminescent layer 304, respectively, an elements which emit white color luminance as a whole can be generated. On the other hand, the structure of forming the anode on the substrate is described in Embodiment 2. However, the present invention is not limited to the structure, and the cathode may be formed on the substrate. Note that, in this case (where the positions of the anode and the cathode are inverted each other), the lamination order of the electroluminescent layer should be also inverted.

Embodiment 3

In Embodiment 3, an example in which a phosphorescent material contained in a laser medium is aligned in a constant direction will be described.

When excitation is carried out by injecting carriers, as the film thickness of the luminescent layer containing the laser medium lessened, luminescence can be efficiently generated with lower electric current. However, the phosphorescent material contained in the laser medium is energetically more stable in a crystalline state rather than in an amorphous state, and tends to be in a microcrystalline state in which a plurality of crystal grains is gathered. Therefore, when the film thickness of the luminescent layer is lessened, a problem in generating leakage current due to electrostatic breakdown or grain boundary is easily occurred. Accordingly, in order to overcome this problem, platinum, which is contained in a plurality of organic metal complexes used for the phosphorescent material, is aligned in a certain direction among the host material.

Figure 6A:
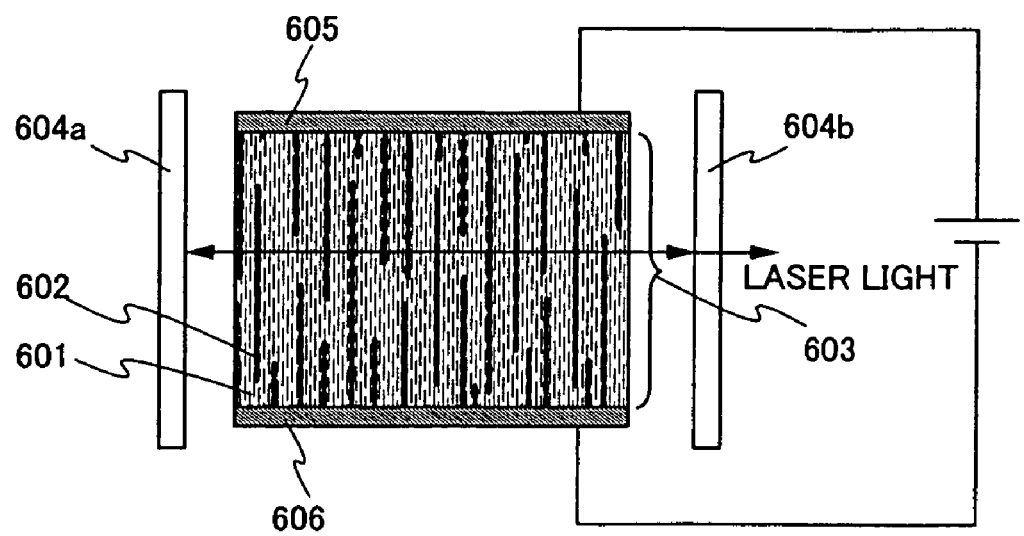
FIGS. 6A and 6B are diagrams showing a structure of the laser oscillator in the case where phosphorescent materials contained in the laser medium is aligned in a certain direction.

As shown in FIG. 6A, a laser medium 603, in which the host material 601 is doped with a plurality of organic metal complexes 602 used for the phosphorescent material, is formed between an anode 605 and a cathode 606 for supplying electric current into the laser medium 603. The plurality of organic metal complexes 602 is aligned among the host material 601 such that the position of platinum is arrayed in the longitudinal direction between the anode 605 and the cathode 606. In the direction perpendicular to the direction between the anode 605 and the cathode 606, array of the plurality of organic metal complexes 602 is dispersed each other by the host material exists therebetween.

According to the constitution above, when the thickness of the luminescent layer is lessened to in the order of several μm while the phosphorescent material is energetically more stable in a crystalline state rather than in an amorphous state, the generation of leakage current due to electrostatic breakdown or grain boundary can be suppressed, thereby preventing deterioration of the light emitting element.

The laser medium 603 is interposed between two reflective materials 604a and 604b, light generated in the laser medium 603 is resonated by the reflective materials, and hence, laser beam is oscillated in the axial direction between the reflective materials 604a and 604b. In FIG. 6A, the alignment direction of the plurality of organic metal complexes 602 intersects with the oscillation direction of laser beam. However, the directions thereof may be identical to each other as depicted in FIG. 6B.

It is assumed that there is a case in which light emitted form the organic metal complexes used as the phosphorescent material is strongly emitted in a certain direction particularly other than light is uniformly emitted in all directions with a central focus on the organic metal complexes. In this case, by matching the direction of strong light with the axial direction between two reflective materials 604a and 604b, the conversion efficiency of photon output can be enhanced while suppressing pumping energy.

Figure 6B:
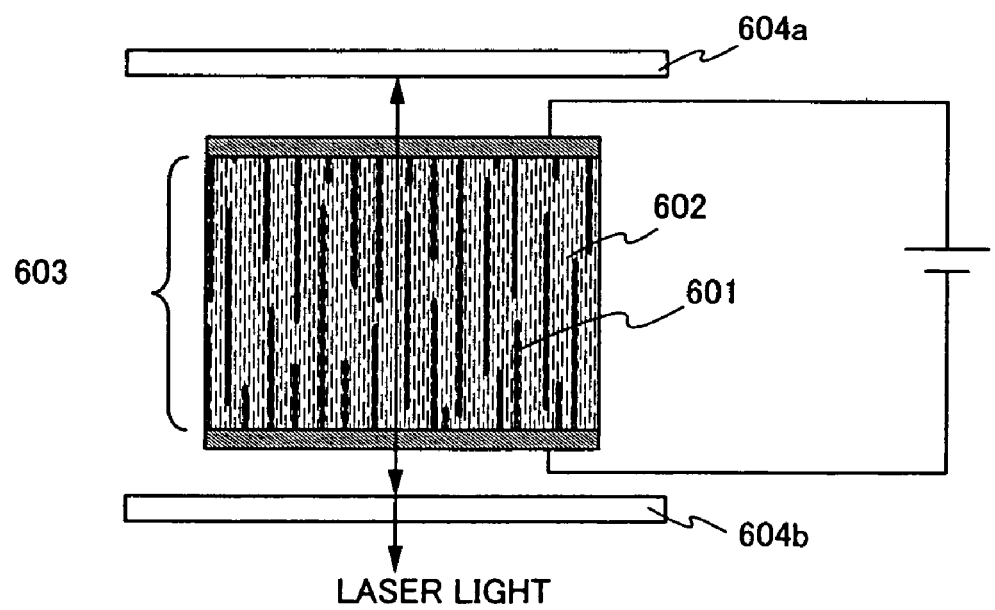

In FIGS. 6A and 6B, a simple structure in which the luminescent layer is interposed between the anode and the cathode is illustrated, respectively. However, the hole injecting layer, the hole transporting layer, the electron transporting layer, the electron injecting layer and the like may be interposed between the luminescent layer and the anode or the cathode.

What is claimed is:

1. A laser oscillator comprising:
   a film containing a laser medium formed over a substrate, the film being interposed between an anode and a cathode;
   an optical resonator comprising a first reflector and a second reflector; and
   a pumping source for supplying pumping energy to the laser medium;
   wherein the laser medium comprises a luminescent layer,
   wherein the substrate, the anode, and the cathode are interposed between the second reflector and the first reflector which is in contact with the substrate, wherein the luminescent layer includes a phosphorescent material dispersed into a host material at a concentration such that the luminescent layer generates excimer emission, wherein the pumping source is electrically connected to the anode or the cathode, wherein the phosphorescent material is an organic metal complex, and wherein in luminescence of the phosphorescent material, light is amplified by the optical resonator.

2. The laser oscillator according to claim 1, further comprising a hole transporting layer contacting with the luminescent layer and formed between the anode and the luminescent layer, the hole transporting layer having an ionization potential that is either (i) lower than that of the luminescent layer or the host material or (ii) higher than that of the luminescent layer or the host material with an energy gap of not more than 0.4 eV.

3. The laser oscillator according to claim 1,
wherein the phosphorescent material generates luminescence having two or more peaks in a wavelength region of not smaller than 500 nm and not larger than 700 nm, and any one of the two or more peaks is excimer emission.

4. The laser oscillator according to claim 1,
wherein the organic metal complex has platinum as its central metal.

5. The laser oscillator according to claim 1,
wherein the concentration is not less than 10 wt %.

6. The laser oscillator according to claim 1,
wherein the second reflector is separated from the cathode.

7. The laser oscillator according to claim 1,
wherein a pinhole is provided between the second reflector and the cathode.

8. A laser oscillator comprising:
a film containing a laser medium formed over a substrate, the film being interposed between an anode and a cathode;

an optical resonator comprising a first reflector and a second reflector and a pumping source for supplying pumping energy to the laser medium;

wherein the laser medium comprises a luminescent layer, wherein the substrate, the anode, and the cathode are interposed between the second reflector and the first reflector which is in contact with the substrate, wherein the luminescent layer includes a phosphorescent material dispersed into a host material at a concentration such tat the luminescent layer generates excimer emission, wherein the anode and the cathode include a light transmitting property, wherein the luminescent layer is interposed between the anode and the cathode, wherein the pumping source is electrically connected to the anode or the cathode, wherein the phosphorescent material is an organic metal complex, and wherein in luminescence from an excimer state of the phosphorescent material, unidirectional light across the film containing the laser medium is amplified by the optical resonator.

9. The laser oscillator according to claim 8, further comprising a hole transporting layer contacting with the luminescent layer and formed between the anode and the luminescent layer, the hole transporting layer having an ionization potential that is either (i) lower than that of the luminescent layer or the host material or (ii) higher than that of the luminescent layer or the host material with an energy gap of not more than 0.4 eV.

10. The laser oscillator according to claim 8,
wherein the phosphorescent material generates luminescence having two or more peaks in a wavelength region of not smaller than 500 nm and not larger than 700 nm, and any one of the two or more peaks is excimer emission.

11. The laser oscillator according to claim 8,
wherein the on organic metal complex has platinum as its central metal.

12. The laser oscillator according to claim 8,
wherein the concentration is not less than 10 wt %.

13. The laser oscillator according to claim 8,
wherein the second reflector is separated from the cathode.

14. The laser oscillator according to claim 8,
wherein a pinhole is provided between the second reflector and the cathode.

15. A laser oscillator comprising:
a film containing a laser medium formed over a substrate, the film being interposed between an anode and a cathode;

an optical resonator comprising a first reflector and a second reflector and a pumping source for supplying pumping energy to the laser medium;

wherein the laser medium comprises a luminescent layer, wherein the substrate, the anode, and the cathode are interposed between the second reflector and the first reflector which is in contact with the substrate, wherein the luminescent layer includes a phosphorescent material dispersed into a host material at a concentration such that the luminescent layer generates excimer emission, wherein the luminescent layer is interposed between the anode and the cathode, wherein the pumping source is electrically connected to the anode or the cathode, wherein the phosphorescent material is an organic metal complex, and wherein in luminescence from an excimer state of the phosphorescent material, unidirectional light contained within a surface composed of the film containing the laser medium is amplified by the optical resonator.

16. The laser oscillator according to claim 15, further comprising a hole transporting layer contacting with the luminescent layer and formed between the anode and the luminescent layer, the hole transporting layer having an ionization potential that is either (i) lower than that of the luminescent layer or the host material or (ii) higher than that of the luminescent layer or the host material with an energy gap of not more than 0.4 eV.

17. The laser oscillator according to claim 15,
wherein the phosphorescent material generates luminescence having two or more peaks in a wavelength region of not smaller than 500 nm and not larger than 700 nm, and any one of the two or more peaks is excimer emission.

18. The laser oscillator according to claim 15,
wherein the organic metal complex has platinum as its central metal.

19. The laser oscillator according to claim 15,
wherein the concentration is not less than 10 wt %.

20. The laser oscillator according to claim 15,
wherein the second reflector is separated from the cathode.

21. The laser oscillator according to claim 15,
wherein a pinhole is provided between the second reflector and the cathode.

22. A laser oscillator comprising:
a film containing a laser medium formed over a substrate, the film being interposed between an anode and a cathode;
an optical resonator comprising a first reflector and a second reflector; and
a pumping source for supplying pumping energy to the laser medium;
wherein the laser medium comprises a luminescent layer,
wherein the substrate, the anode, and the cathode are interposed between the second reflector and the first reflector which is in contact with the substrate,
wherein the luminescent layer includes a phosphorescent material dispersed into a host material at a concentration such that the luminescent layer generates excimer emission,
wherein the optical resonator comprises a plurality of reflective materials,
wherein the anode includes a light transmitting property,
wherein the luminescent layer is interposed between the cathode and the plurality of reflective materials,
wherein the pumping source is electrically connected to the anode or the cathode,
wherein the phosphorescent material is an organic metal complex, and
wherein in luminescence from an excimer state of the phosphorescent material, unidirectional light across the film containing the laser medium is amplified by the cathode and the plurality of reflective materials.

23. The laser oscillator according to claim 22, further comprising a hole transporting layer contacting with the luminescent layer and formed between the anode and the luminescent layer, the hole transporting layer having an ionization potential that is either (i) lower than that of the luminescent layer or the host material or (ii) higher than that of the luminescent layer or the host material with an energy gap of not more than 0.4 eV.

24. The laser oscillator according to claim 22,
wherein the phosphorescent material generates luminescence having two or more peaks in a wavelength region of not smaller than 500 nm and not larger than 700 nm, and any one of the two or more peaks is excimer emission.

25. The laser oscillator according to claim 22,
wherein the organic metal complex has platinum as its central metal.

26. The laser oscillator according to claim 22,
wherein the concentration is not less than 10 wt %.

27. The laser oscillator according to claim 22,
wherein the second reflector is separated from the cathode.

28. The laser oscillator according to claim 22,
wherein a pinhole is provided between the second reflector and the cathode.

29. A laser oscillator comprising:
a film containing a laser medium formed over a substrate, the film being interposed between an anode and a cathode;
an optical resonator comprising a first reflector and a second reflector; and
a pumping source for supplying pumping energy to the laser medium;
wherein the laser medium comprises a luminescent layer,
wherein the substrate, the anode, and the cathode are interposed between the second reflector and the first reflector which is in contact with the substrate,
wherein the luminescent layer includes a host material and a phosphorescent material dispersed into the host material at a concentration such that the luminescent layer generates excimer emission,
wherein at least one of the anode and the cathode includes a light transmitting property,
wherein the luminescent layer is interposed between the anode and the cathode,
wherein the pumping source is electrically connected to the anode or the cathode,
wherein the phosphorescent material is an organic metal complex, and
wherein in luminescence from an excimer state of the phosphorescent material, light is amplified by the optical resonator.

30. The laser oscillator according to claim 29, further comprising a hole transporting layer contacting with the luminescent layer and formed between the anode and the luminescent layer, the hole transporting layer having an ionization potential that is either (i) lower than that of the luminescent layer or the host material or (ii) higher than that of the luminescent layer or the host material with an energy gap of not more than 0.4 eV.

31. The laser oscillator according to claim 29,
wherein the phosphorescent material generates luminescence having two or more peaks in a wavelength region of not smaller than 500 nm and not larger than 700 nm, and any one of the two or more peaks is excimer emission.

32. The laser oscillator according to claim 29,
wherein the organic metal complex has platinum as its central metal.

33. The laser oscillator according to claim 29,
wherein the concentration is not less than 10 wt %.

34. The laser oscillator according to claim 29,
wherein the second reflector is separated from the cathode.

35. The laser oscillator according to claim 29,
wherein a pinhole is provided between the second reflector and the cathode.

* * * * *